United States Patent
Kitano (10) Patent No.: US 7,136,345 B2
(45) Date of Patent: Nov. 14, 2006

(54) OPTICAL PICKUP DEVICE AND OPTICAL DISK DEVICE

(75) Inventor: Hisashi Kitano, Tachikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 655 days.

(21) Appl. No.: 10/607,534

(22) Filed: Jun. 27, 2003

(65) Prior Publication Data

US 2004/0047273 A1    Mar. 11, 2004

(30) Foreign Application Priority Data

Jun. 28, 2002    (JP)    ............................. 2002-191395

(51) Int. Cl.
*G11B 7/00*    (2006.01)

(52) U.S. Cl. ..................................... 369/121

(58) Field of Classification Search ................. 369/121
See application file for complete search history.

(56) References Cited

U.S. PATENT DOCUMENTS 4,978,844 A * 12/1990 Ujihara ....................... 250/216

5,216,648 A * 6/1993 Noda et al. ............... 369/44.14

FOREIGN PATENT DOCUMENTS

| JP | 5-335689 | | 12/1993 |
| JP | 10-177731 | * | 6/1998 |
| JP | 10-177731 A | | 6/1998 |

OTHER PUBLICATIONS

Japanese Office Action dated May 10, 2005 for Appln. No. 2002-191395.

* cited by examiner

*Primary Examiner*—Wayne Young
*Assistant Examiner*—Van T. Pham
(74) *Attorney, Agent, or Firm*—Pillsbury Winthrop Shaw Pittman, LLP (57) ABSTRACT

An optical pickup device includes a frame F in which an integrated optical unit equipped with a semiconductor laser diode is incorporated and a flexible substrate F having a short-circuit wiring pathway connecting two connectors and a driving circuit. The short-circuit wiring pathway is connected to the integrated optical unit and the driving circuit at a minimum distance through the connector in such a manner that the flexible substrate F is incorporated so as to be wound along the frame F. Consequently, recording processing and the like can be stably performed.

17 Claims, 6 Drawing Sheets

OPTICAL PICKUP DEVICE AND OPTICAL DISK DEVICE

CROSS-REFERENCE TO RELATED APPLICATIONS

This application is based upon and claims the benefit of priority from the prior Japanese Patent Application No. 2002-191395, filed Jun. 28, 2002, the entire contents of which are incorporated herein by reference.

BACKGROUND OF THE INVENTION

1. Field of the Invention

The present invention relates to an optical pickup device which performs recording/reproducing processing to an optical disk and an optical disk device using the same, and particularly relates to an optical pickup device which has a flexible substrate having a short-circuit wiring portion and an optical disk device using the same.

2. Description of the Related Art

In recent years, optical disks become widespread and high performance is required for optical disk devices for performing recording/reproducing processing. In a conventional optical disk device, a high-frequency wave of about 350 MHz is superimposed on a semiconductor laser diode mounted on an integrated optical unit IOU in the optical pickup device from a driving circuit of the semiconductor laser diode formed on a flexible substrate, in order to improve signal characteristics during reproducing a DVD (Digital Versatile Disc).

However, in case of a long distance between the integrated optical unit on which the semiconductor laser diode is mounted and the driving circuit on the flexible substrate, because of superimposing the high-frequency, attenuation of a driving signal and generation of heat occur under the influence of line inductance in a wiring path detouring on the flexible substrate. This causes a serious problem in the case of writing processing, which requires laser driving current of about tenfold of energy compared with read of a ROM (Read Only Memory), and also a problem of degradation of writing characteristics.

That is, in the flexible substrate of the conventional optical pickup apparatus, when the high-frequency wave is superimposed on the semiconductor laser diode in reproducing DVD and CD, in the case of the long wiring path between the semiconductor laser diode and the driving circuit on the flexible substrate, the attenuation of the driving signal and the generation of heat occur under the influence of line inductance. Also, an unnecessary electromagnetic wave is also generated, which results in the degradation of the writing characteristics into the optical disk.

BRIEF SUMMARY OF THE INVENTION

According to one aspect of the present invention, there is an optical pickup device comprises a frame; an integrated optical unit incorporated in the frame and equipped with a first semiconductor laser diode; a flexible substrate having a first connector on one end thereof, a second connector on other end thereof, and a first short-circuit wiring pathway connected between the first connector and the second connector; and a driving circuit formed on the flexible substrate for driving the first semiconductor laser diode, wherein the flexible substrate is wound along the frame, so that the first connector of the short-circuit wiring pathway is connected to the optical unit and thereby connected to the semiconductor laser diode, and the second connector is connected to the driving circuit, which allows driving current to be supplied from the driving circuit to the semiconductor laser diode through the short-circuit wiring pathway.

DETAILED DESCRIPTION OF THE INVENTION

Figure 1:
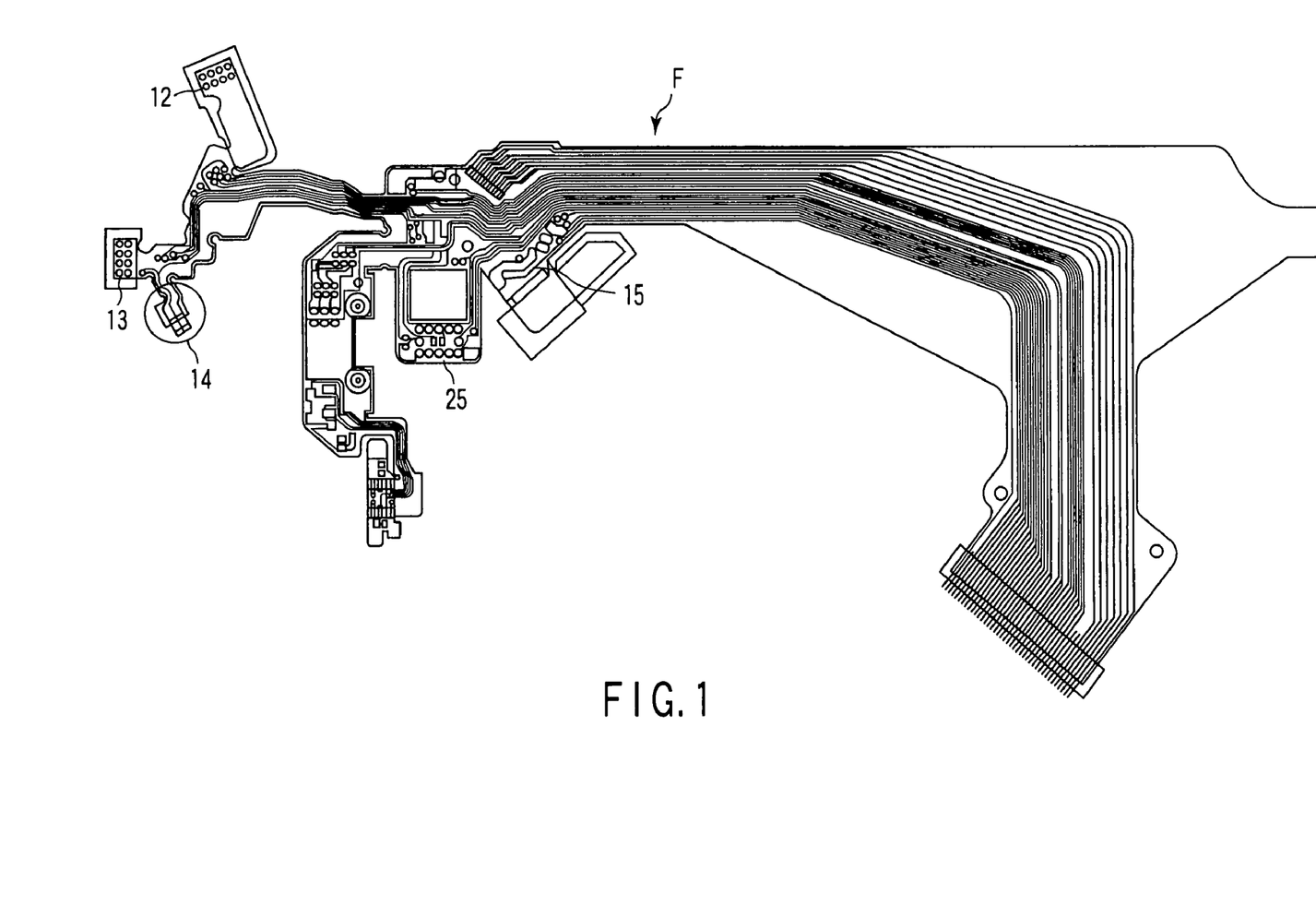
FIG. 1 is a view showing an example of a flexible substrate for use in an optical pickup device according to an embodiment of the invention.
Figure 3:
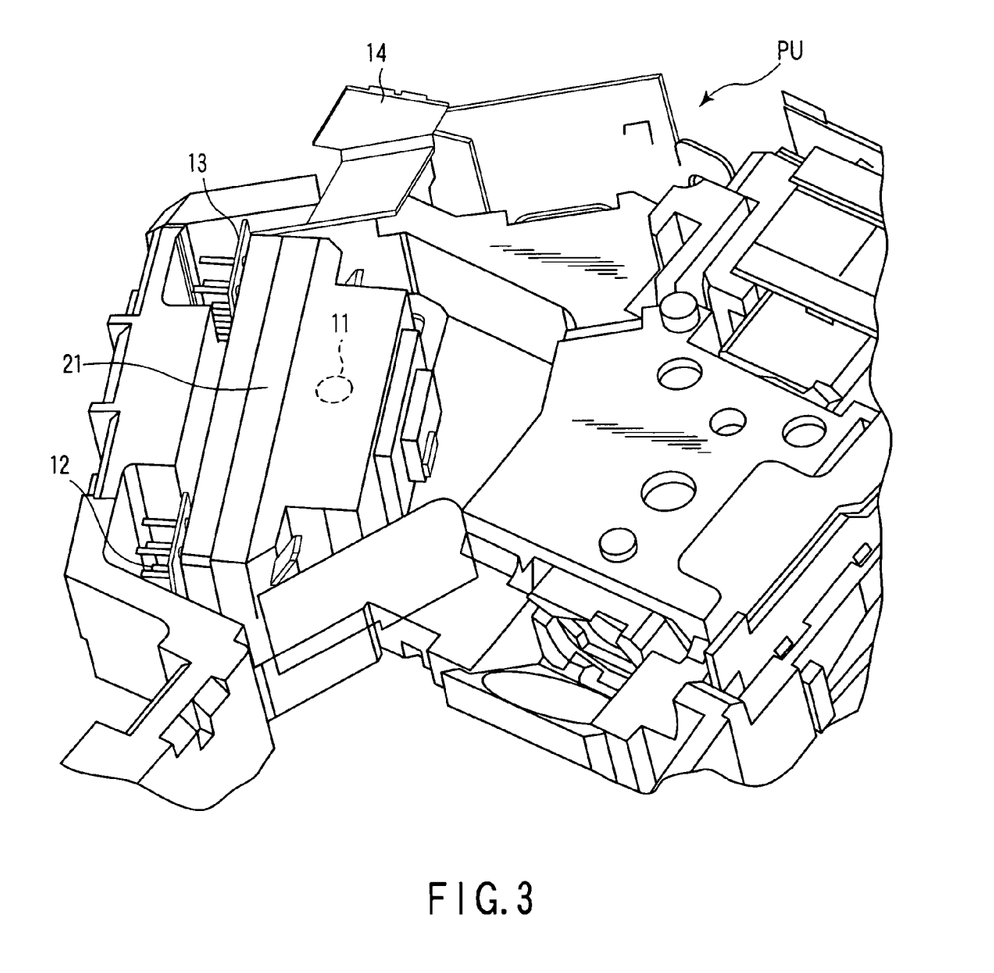
FIG. 3 is an enlarged view showing an example of the optical pickup device equipped with the flexible substrate according to the embodiment of the invention.
Figure 4:
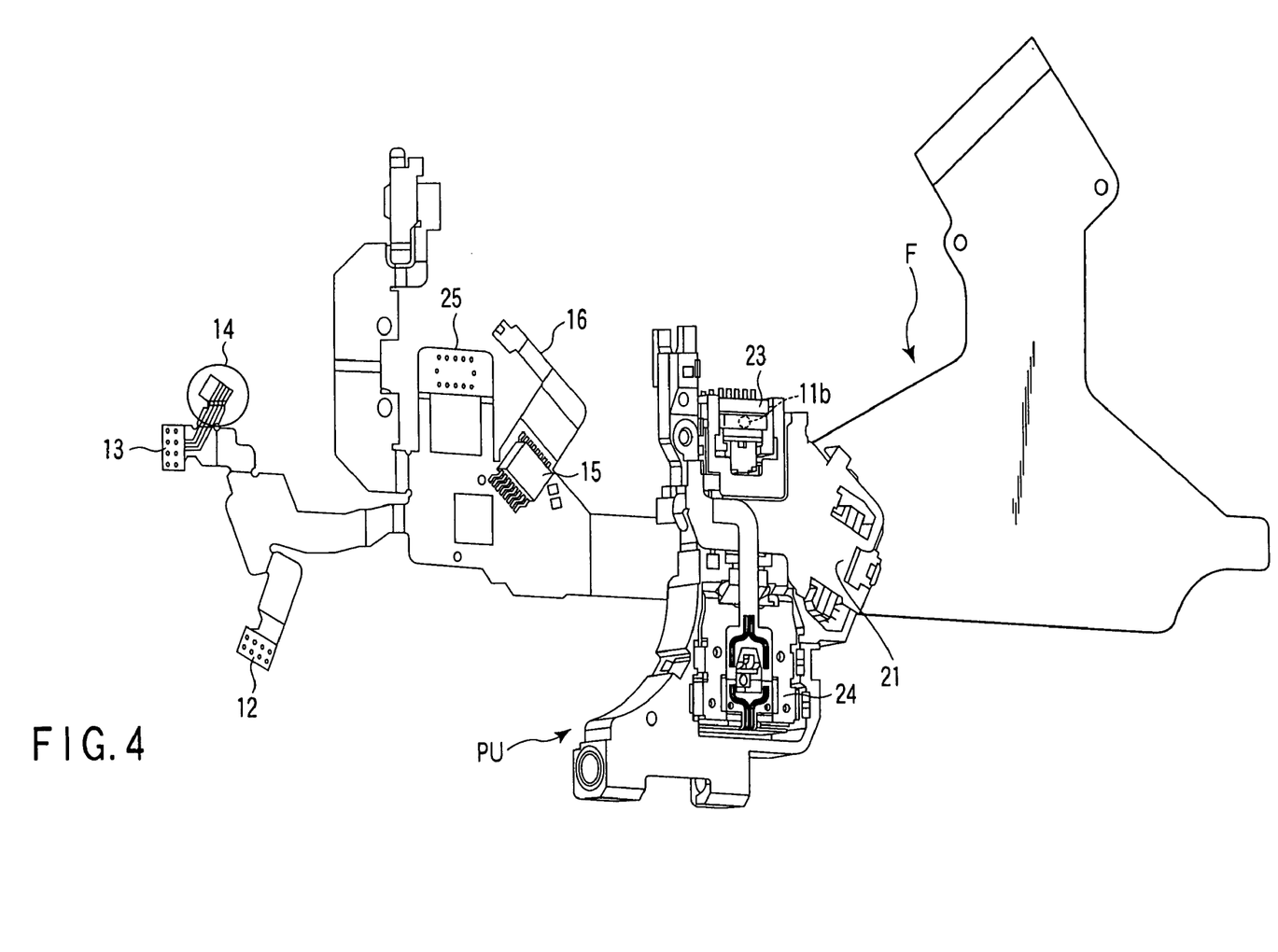
FIG. 4 is a view showing a backside of an example of the flexible substrate and the optical pickup device according to the embodiment of the invention.
Figure 5:
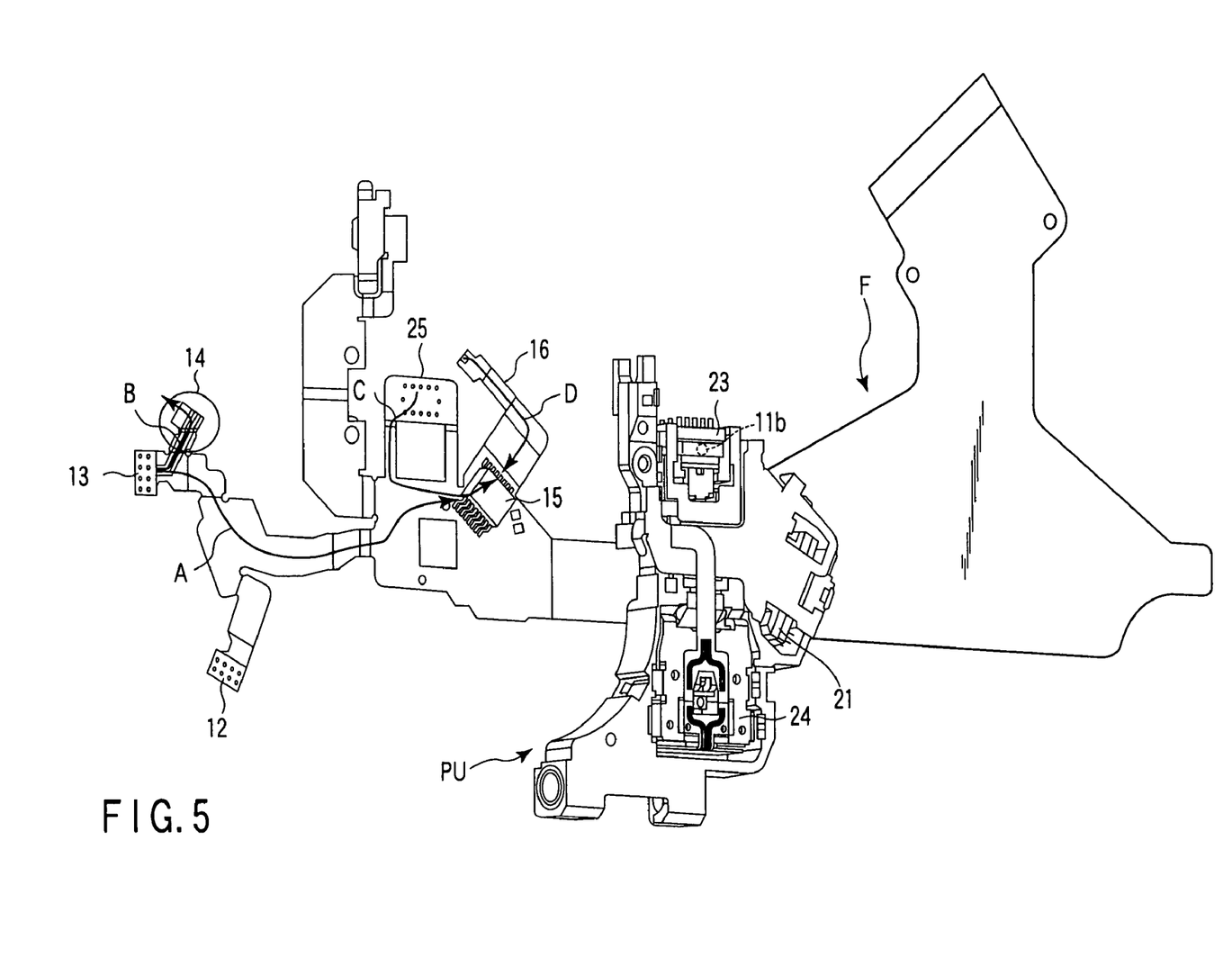
FIG. 5 is a view for comparison of a wiring path on the flexible substrate to a short-circuit wiring portion according to the embodiment of the invention.
Figure 6:
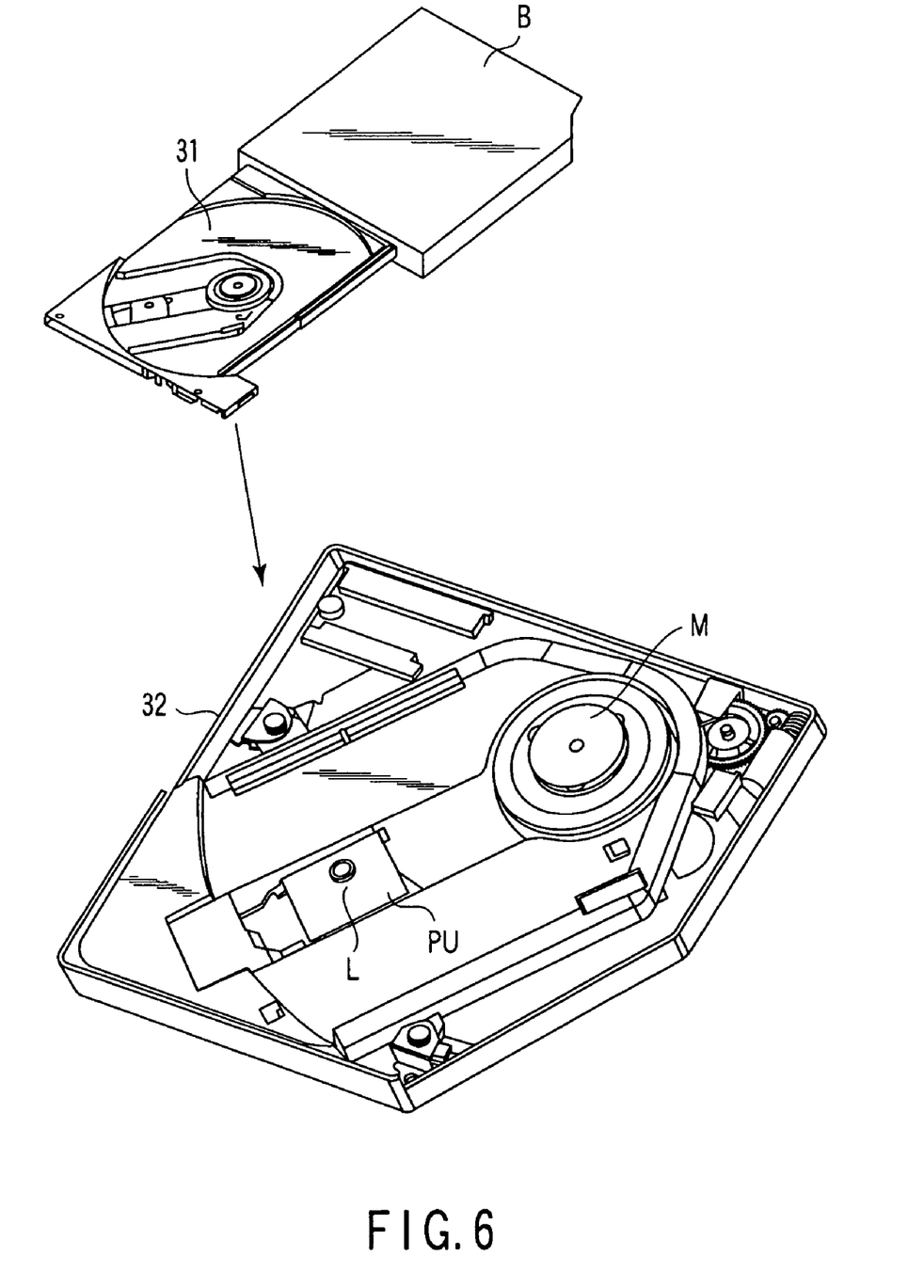
FIG. 6 is a view showing an example of an optical disk device in which the optical pickup device according to the embodiment of the invention is used.

Referring to the accompanying drawings, an optical pickup device and an optical disk device of a preferred embodiment of the invention will be described in detail below. FIG. 1 is a view showing an example of a flexible substrate for use in the optical pickup device according to the embodiment of the invention, FIG. 2 is a view showing an example of the optical pickup device equipped with the flexible substrate according, FIG. 3 is an enlarged view showing an example of the optical pickup device equipped with the flexible substrate, FIG. 4 is a view showing a backside of an example of the flexible substrate and the optical pickup device, FIG. 5 is a view for comparison of a wiring path on the flexible substrate to a short-circuit wiring portion, and FIG. 6 is a view showing an example of an optical disk device in which the optical pickup device is used.

(Optical Pickup Apparatus and Optical Disk Device)

Figure 2:
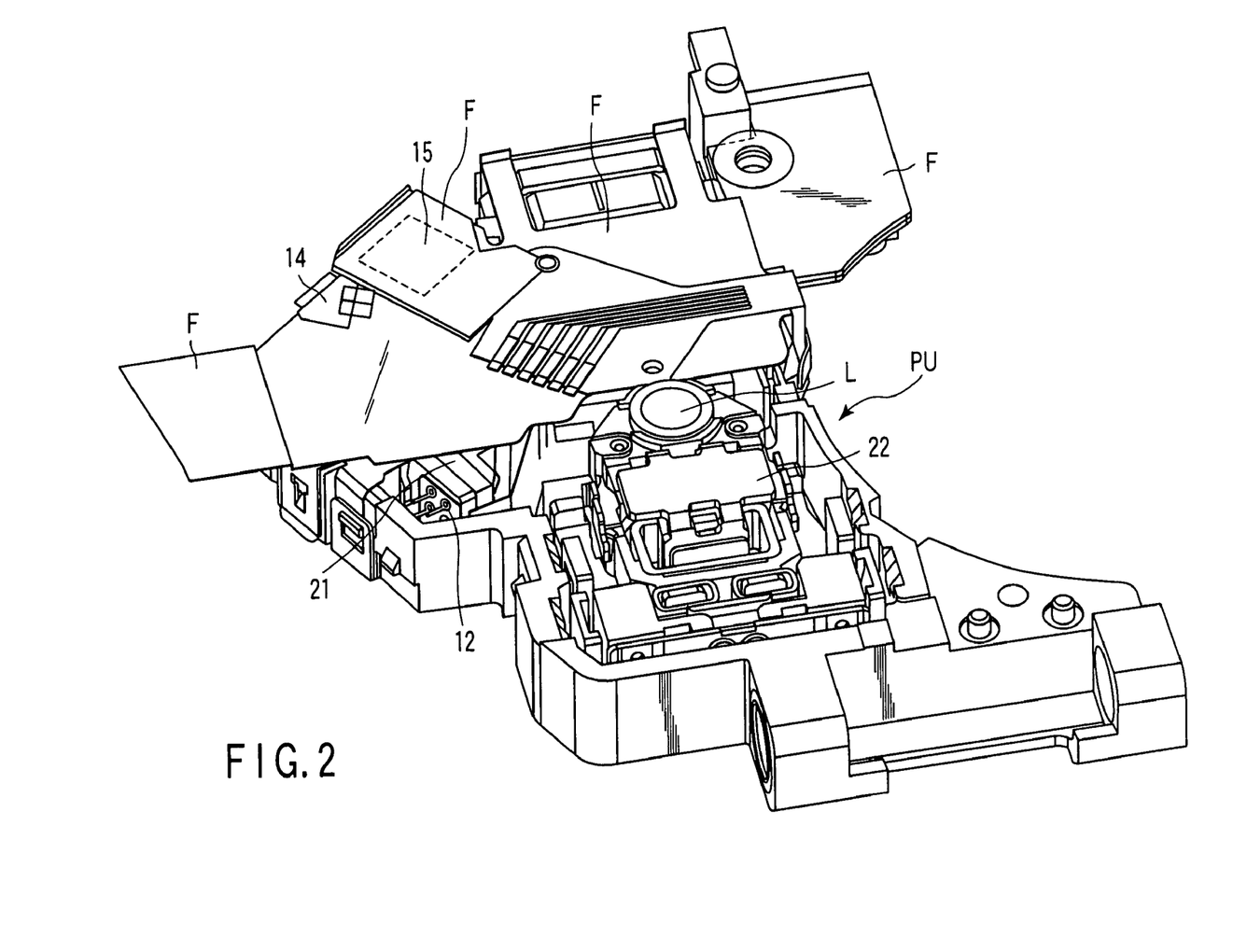
FIG. 2 is a view showing an example of the optical pickup device equipped with the flexible substrate according to the embodiment of the invention.

In these figures, the optical pickup device includes an optical pickup unit (PU) shown in FIG. 2, which is equipped with a flexible substrate F shown in FIG. 1. The flexible substrate F includes an integrated circuit 15 having a driving circuit for driving a semiconductor laser diode emitting a laser beam, an integrated optical unit 21 for, e.g. DVD, on which the semiconductor laser diode is mounted, and an actuator 22 having a lens L mounted thereon and controlling an irradiating direction of the laser beam in a focusing direction and a tracking direction. As shown in FIG. 4, the flexible substrate F further includes an integrated optical unit 23 for, e.g. CD, and semiconductor laser diodes 11 and 11b, which are mounted on the integrated optical units 21 and 23, respectively, are driven with a driving circuit in the integrated circuit 15. In addition to the semiconductor laser diodes 11 and 11b emitting the laser beam, the integrated optical units 21 and 23 have electronic components such as a capacitor and a resister and a function of hologram diffraction.

The laser beam emitted from each semiconductor laser diode in the integrated optical units 21 and 23 is condensed with the lens L provided on the actuator through an optical path, an optical disk (not shown) is irradiated with the laser beam, and recording processing and the reproducing processing are performed.

FIG. 6 is a schematic view showing an example of an optical disk device B equipped with the optical pickup device. The optical disk device B includes a pickup unit PU formed in a chassis 32 provided on a drawer 31, and a spindle motor M rotating the optical disk at a predetermined rotational speed. The optical disk device B also includes a spindle driving circuit (not shown) for driving the spindle motor M, and a focusing control circuit and a tracking control circuit for performing focusing control and tracking control of an actuator 24 by receiving plural detected signals from plural photodetectors (not shown) in the integrated optical units 21 and 23 in the pickup unit PU to generate a focusing error signal and a tracking error signal, respectively. Further, the optical disk device B has a control circuit for controlling the whole operation and an interface portion for communicating with an external device by the detected signal or a recording/reproducing signal.

(Short-Circuit Wiring Between Semiconductor Laser Diode and Driving Circuit)

The short circuit wiring between the semiconductor laser diode and the driving circuit, which is a feature of the invention, will be described in detail below referring to the drawings. In the optical pickup device, the flexible substrate F is mounted on the optical pickup apparatus PU, and various kinds of electronic components are incorporated in the flexible substrate F and connected to each unit provided on the optical pickup unit PU. At this point, it is worthy of note that each unit in the optical pickup unit PU is not always connected to the electronic components on the flexible substrate F in the shortest distance because the flexible substrate F is mounted so as to be folded and wrapped depending on a shape of the optical pickup unit PU.

For example, as shown in FIGS. 2 and 3, the driving circuit 15 for the semiconductor laser diode mounted on the flexible substrate F is connected to the semiconductor laser diode 11 in the integrated optical unit 21 through a connector 13 and a wiring path A on the flexible substrate F. Accordingly, the long wiring path is formed and the attenuation of the driving signal and the generation of heat occur under the influence of the line inductance. This causes the degradation of the writing characteristics, in particular, in the case of the writing processing which requires the laser driving current of the about tenfold of energy compared with the reading.

A short-circuit wiring portion 14 according to the embodiment of the invention, provided as the extension of the flexible substrate F, has the shape shown in FIG. 1. When connectors 12 and 13 of the flexible substrate F are connected to the integrated optical unit 21 for DVD as shown in FIG. 3, the short-circuit wiring portion 14 is integrally formed by routing the wiring from the connector 13. As shown in FIG. 2, the short-circuit wiring portion 14 is routed in proximity to the integrated circuit having the driving circuit 15 of the flexible substrate F, and, as shown in FIG. 3, an end portion of the short-circuit wiring portion 14 is folded and soldered to the flexible substrate F to be connected to the integrated circuit with the shortest distance. Thus, by the routing the short-circuit wiring portion 14 so as to crawl through clearance of the structure, mechanical stability can be brought into the wiring.

For example, an anode and a cathode of the semiconductor laser diode 11 are connected to the driving circuit 15 with the short-circuit wiring portion 14 through the connector 13.

Accordingly, driving current is supplied from the driving circuit 15 to the semiconductor laser diode 11, and thereby the optical disk is irradiated with the laser beam emitted from the laser diode 11.

Furthermore, on the flexible substrate F, it is possible that there is a wiring path between the driving circuit 15 and the semiconductor laser diode 11 of the integrated optical unit 21 besides the pathway of the short-circuit wiring portion 14, mainly power of the semiconductor laser diode 11 is supplied from the driving circuit 15 to the semiconductor laser diode 11 through the connector 13.

FIG. 5 shows the wiring path A (ground line) in the case where the semiconductor laser diode is connected to the driving circuit by utilizing the wiring path formed on the flexible substrate F and a wiring path B (signal line) in the case of utilizing the short-circuit wiring portion 14 according to the embodiment of the invention. According to FIG. 5, the semiconductor laser diode can be connected to the driving circuit in the distance of about 10% of the wiring path A (ground line) on the flexible substrate F with the short-circuit wiring portion 14 according to the embodiment of the invention. This allows avoidance of the problem such as the unnecessary radiation, the unnecessary generation of heat, and unstable operation caused by disturbance, and the recording/reproducing processing to the optical disk with the stable laser emission.

On the other hand, in the same way as the case of DVD, a short-circuit wiring portion 16 is also provided between laser diode of the integrated optical unit 23 for CD and the driving circuit 15. By way of example, the anode and cathode of a semiconductor laser diode 11b are supplied from the driving circuit 15 to the short-circuit wiring portion 16 through a connector 25.

Further, on the flexible substrate F, there is a wiring path between the driving circuit 15 and the semiconductor laser diode 11b of the integrated optical unit 23 besides the pathway of the short-circuit wiring portion 16, mainly power of the semiconductor laser diode 11b is supplied from the driving circuit 15 to the semiconductor laser diode 11b through the connector 25.

FIG. 5 shows a wiring path C in the case where the semiconductor laser diode 11b of the integrated optical unit 23 is connected to the driving circuit 15 by utilizing the wiring path formed on the flexible substrate F and a wiring path D in the case of utilizing the short-circuit wiring portion 16 according to the embodiment of the invention. According to FIG. 5, the semiconductor laser diode 11b can be connected to the driving circuit 15 in the distance of about 80% of the wiring path A (ground line) on the flexible substrate F with the short-circuit wiring portion 16 according to the embodiment of the invention. Like the case of DVD, this allows avoidance of the problem such as the unnecessary radiation, the unnecessary generation of heat, and unstable operation caused by disturbance, and the recording/reproducing processing to the optical disk with the stable laser emission.

Except that the short-circuit wiring portion according to the embodiment of the invention is provided as a part of the flexible substrate F, it is preferable to provide the short-circuit wiring portion as the wiring independent of the flexible substrate F or the wiring using a second flexible substrate. In this case, the same principle as the above-described effect and advantage also enables the recording/reproducing processing to the optical disk with the stable laser emission.

Though those skilled in the art can realize the invention by the various embodiments described above, it is easy for those skilled in the art to think of various kinds of modifications of the embodiments and to apply the invention to various modes without any inventive ability. Accordingly, the invention covers a wide range consistent to the disclosed principle and the novel feature and is not limited to the above-described embodiment.

As described in detail above, according to the invention, the optical pickup device and the optical disk device using the same, which allow the stable recording processing without unnecessary radiation and the generation of heat in a manner that provides the flexible substrate having the short-circuit wiring portion which directly connects the integrated optical unit having the semiconductor laser diode to the driving circuit for the semiconductor laser diode, which is mounted on the flexible substrate.

What is claimed is:

1. An optical pickup device comprising:
   a frame;
   an integrated optical unit incorporated in the frame and equipped with a first semiconductor laser diode;
   a flexible substrate having a first connector on one end thereof, a second connector on other end thereof, and a first short-circuit wiring pathway connected between the first connector and the second connector; and
   a driving circuit formed on the flexible substrate for driving the first semiconductor laser diode,
   wherein the flexible substrate is wound along the frame, so that the first connector of the short-circuit wiring pathway is connected to the optical unit and thereby connected to the semiconductor laser diode, and the second connector is connected to the driving circuit, which allows driving current to be supplied from the driving circuit to the semiconductor laser diode through the short-circuit wiring pathway.

2. An optical pickup device according to claim 1, wherein the first short-circuit wiring pathway is formed as an extension of a substrate and integrally formed with the flexible substrate.

3. An optical pickup device according to claim 1, further comprising:
   a second integrated optical unit incorporated in the frame and equipped with a second semiconductor laser diode;
   a second driving circuit formed on the flexible substrate for driving the second semiconductor laser diode; and
   a second short-circuit wiring pathway provided on the flexible substrate, connected between a third connector at one end thereof and a fourth connector at the other end thereof, wherein the flexible substrate is wound along the frame, so that the third connector of the second short-circuit wiring pathway is connected to the second integrated optical unit and thereby connected to the second semiconductor laser diode, and the fourth connector is connected to the second driving circuit, which allows driving current to be supplied from the second driving circuit to the second semiconductor laser diode thorough the second short-circuit wiring pathway.

4. An optical disk device comprising:
   a frame;
   an integrated optical unit incorporated in the frame and equipped with a first semiconductor laser diode;
   a rotating motor rotating an optical disk relative to a laser beam emitted from the first semiconductor laser diode mounted on the integrated optical unit incorporated in the frame;
   a flexible substrate having a first connector on one end thereof, a second connector on other end thereof, and a first short-circuit wiring pathway connected between the first connector and the second connector; and
   a driving circuit formed on the flexible substrate for driving the semiconductor laser diode,
   wherein the flexible substrate is wound along the frame, so that the first connector is connected to the integrated optical unit and thereby connected to the semiconductor laser diode, and the second connector is connected to the first driving circuit, which allows driving current to be supplied from the first driving circuit to the semiconductor laser diode thorough the first short-circuit pathway.

5. An optical disk device according to claim 4, wherein the first short-circuit wiring pathway is formed as an extension of a substrate and integrally formed with the flexible substrate.

6. An optical disk device according to claim 4, further comprising:
   a second integrated optical unit incorporated in the frame and equipped with a second semiconductor laser diode;
   a second driving circuit formed on the flexible substrate for driving the second semiconductor laser diode; and
   a second short-circuit wiring pathway provided on the flexible substrate, connected between a third connector at one end thereof and a fourth connector at the other end thereof, wherein the flexible substrate is wound along the frame, so that the third connector of the second short-circuit wiring pathway is connected to the second integrated optical unit and thereby connected to the second semiconductor laser diode, and the fourth connector is connected to the second driving circuit, which allows driving current to be supplied from the second driving circuit to the second semiconductor laser diode thorough the second short-circuit wiring pathway.

7. An optical pickup device comprising:
   a frame;
   an integrated optical unit incorporated in the frame and equipped with a first semiconductor laser diode;
   a first driving circuit driving the semiconductor laser diode; and
   a flexible substrate connected to the integrated optical unit and the first driving circuit, and having a first wiring path and a second wiring path longer than the first wiring path,
   wherein the first driving circuit supplies a driving current to the first semiconductor laser diode thorough the first wiring path, and the second wiring path is ground.

8. An optical pickup device according to claim 7, wherein the first wiring path is formed as an extension of a substrate integrally formed with the flexible substrate.

9. An optical pickup device according to claim 7, wherein the first wiring path connects an anode and a cathode of the first semiconductor laser diode to the driving circuit.

10. An optical pickup device according to claim 7, further comprising:
    a second integrated optical unit incorporated in the frame, and equipped with a second semiconductor laser diode emitting a second laser beam to a lens on a lens actuator;

a second driving circuit driving the second semiconductor laser diode; and a third wiring path shorter than a fourth wiring path, provided on the flexible substrate;

wherein the second driving circuit supplies a driving current to the second semiconductor laser diode through the third wiring path, and the fourth wiring path is ground.

11. An optical pickup device according to claim 7, wherein the first semiconductor laser diode of the first integrated optical unit emits a first laser beam for recording or reproducing to a DVD, and the second semiconductor laser diode of the second integrated optical unit emits a second laser beam for recording or reproducing to a CD, the second laser beam having a different wavelength from that of the first laser beam.

12. An optical disk device comprising:

a frame;

an integrated optical unit incorporated in the frame and equipped with a semiconductor laser diode;

a rotating motor which rotates an optical disk relative to a laser beam emitted from the semiconductor laser diode mounted on the integrated optical unit;

a first driving circuit driving the semiconductor laser diode; and a flexible substrate which is connected to the integrated optical unit and the first driving circuit, and having a first wiring path and a second wiring path which is longer than the first wiring path;

wherein the first driving circuit supplies a driving current to the first semiconductor laser diode thorough the first wiring path, and the second wiring path is ground.

13. An optical disk device according to claim 12, wherein the second wiring path is formed as an extension of a substrate integrally formed with the flexible substrate.

14. An optical disk device according to claim 12, wherein the second wiring path connects an anode and a cathode of the semiconductor laser diode to the driving circuit.

15. An optical disk device according to claim 12, further comprising:

a second integrated optical unit incorporated in the frame, and equipped with a second semiconductor laser diode emitting a second laser beam to a lens on a lens actuator;

a second driving circuit driving the second semiconductor laser diode; and a third wiring path shorter than a fourth wiring path, provided on the flexible substrate;

wherein the second driving circuit supplies a driving current to the second semiconductor laser diode through the third wiring path, and the fourth wiring path is ground.

16. An optical disk device according to claim 15, wherein the first semiconductor laser diode of the first integrated optical unit emits a first laser beam for recording or reproducing to a DVD, and the second semiconductor laser diode of the second integrated optical unit emits a second laser beam for recording or reproducing to a CD, the second laser beam having a different wavelength from that of the first laser beam.

17. A flexible substrate which is wound along a frame, connected to an integrated optical unit incorporated in the frame and equipped with a first semiconductor laser diode, and connected to a driving circuit formed on the flexible substrate for driving the first semiconductor laser diode, comprising:

a first connector on one end thereof; and a second connector on other end thereof, and a first short-circuit wiring pathway connected between the first connector and the second connector;

wherein the flexible substrate is wound along the frame, so that the first connector of the short-circuit wiring pathway is connected to the optical unit and thereby connected to the semiconductor laser diode, and the second connector is connected to the driving circuit, which allows driving current to be supplied from the driving circuit to the semiconductor laser diode through the short-circuit wiring pathway.

* * * * *